(12) United States Patent
Yoo

(10) Patent No.: US 7,330,691 B2
(45) Date of Patent: Feb. 12, 2008

(54) IMAGE FORMING APPARATUS

(75) Inventor: Young-ho Yoo, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 10/975,351

(22) Filed: Oct. 29, 2004

(65) Prior Publication Data

US 2005/0163547 A1   Jul. 28, 2005

(30) Foreign Application Priority Data

Jan. 27, 2004  (KR) .................... 10-2004-0004978

(51) Int. Cl.
*G03G 15/00* (2006.01)
(52) U.S. Cl. .................... 399/367; 399/374
(58) Field of Classification Search ......... 399/367–380
See application file for complete search history.

(56) References Cited

U.S. PATENT DOCUMENTS

| | | | | |
|---|---|---|---|---|
| 4,695,154 A | * | 9/1987 | Watanabe | 399/376 |
| 5,258,779 A | * | 11/1993 | Serizawa et al. | 346/134 |
| 5,748,345 A | * | 5/1998 | Ozaki et al. | 358/537 |
| 6,141,525 A | * | 10/2000 | Tahara | 399/395 |
| 6,778,197 B2 | * | 8/2004 | Yamanaka | 347/129 |
| 6,907,206 B2 | * | 6/2005 | Hattori et al. | 399/90 |

FOREIGN PATENT DOCUMENTS

| | | |
|---|---|---|
| JP | 05-027487 | 2/1993 |
| JP | 06-314000 | 11/1994 |
| JP | 2002-311667 | 10/2002 |
| JP | 2003-165259 | 6/2003 |
| JP | 2003-195594 | 7/2003 |
| KR | 2000-0073156 | 12/2000 |
| KR | 2002-0018121 | 3/2002 |

* cited by examiner

*Primary Examiner*—Anthony H. Nguyen
(74) *Attorney, Agent, or Firm*—Roylance, Abrams, Berdo & Goodman, LLP

(57) ABSTRACT

An image forming apparatus including a conveying unit for conveying a document, on which an image is recorded, along a predetermined conveying path, a scan unit that is disposed on the conveying path of the document for scanning the image recorded on the document, and a control unit for controlling the conveying unit and the scan unit. The control unit includes a main circuit board that controls operations of the scan unit and converts the scanned image into digital image information, and a sub-circuit board that controls operations of the conveying unit, and wherein the sub-circuit board includes a high voltage signal area on which a high voltage signal is routed, and a low voltage signal area on which a low voltage signal is routed.

18 Claims, 4 Drawing Sheets

IMAGE FORMING APPARATUS

CROSS-REFERENCE TO RELATED APPLICATIONS

This application claims the benefit under 35 U.S.C. §119(a) of Korean Patent Application No. 2004-4978, filed in the Korean Intellectual Property Office on Jan. 27, 2004, the entire content of which is incorporated herein by reference.

BACKGROUND OF THE INVENTION

1. Field of the Invention

The present invention relates to an image forming apparatus. More particularly, the present invention relates to an image forming apparatus having a structure for improving an assembly of the apparatus and a noise characteristic of a control signal.

2. Description of the Related Art

In general, an image forming apparatus is an apparatus that receives image signals and transfers images on a document. In addition, an image forming apparatus having an image scan function is an apparatus that reads an image recorded on a document, and converts the image into digital image information so that the image can be displayed on another paper or display device, such as a facsimile or a scanner.

The image forming apparatus having the image scan function typically includes a conveying unit that induces the document, on which the image is recorded, along a predetermined path into the image forming apparatus, and then discharges the document out of the image forming apparatus along a predetermined path. The conveying unit includes various kinds of rollers and a driving unit, such as a motor and a clutch, for driving the rollers.

In addition, the image forming apparatus typically includes a control unit for controlling operations of the conveying unit. In the conventional image forming apparatus having the image scan function, the control unit is constructed with a printed circuit board (PCB) having a microcomputer. For example, the conveying unit and scan unit that reads the image, are controlled using one PCB, such that the read image is converted into the digital image information. As described above, in the control unit comprising one PCB, wires for connecting the conveying unit and the scan unit or other elements, are concentrated on one PCB, thus it is not easy to order the wires and ensure a space on the PCB for connecting the wires. Consequently, the assembly of the image forming apparatus is degraded and excessively complicated.

Also, since sensors for detecting the position of the document on the conveying path are typically disposed some distance from the PCB, a number of long wires corresponding to the separation distance are used. Thus, the wires may protrude into the conveying path of the document, and may interrupt the conveying operation of the document.

In addition, signals of 3.3V~5V are generally transmitted between the sensors and the PCB, however, the signal characteristics of the low voltage signal is degraded when the length of the wire becomes longer. Thus, noise may be generated due to the long wires between the sensors and the PCB.

A 24V signal that has a relatively higher voltage than the signal on the sensor connection wires is applied to the wire connecting the driving unit, such as the motor and the clutch, for driving the conveying rollers to the PCB. However, as described above, it is not easy to ensure the space for arranging the wires, thus the wire on which the 24V signal flows, may be adjacent to the sensor connection wires, on which the low voltage signals flow, and accordingly, a noise signal may be generated on the sensor connection wires by the high voltage signal.

Accordingly, a need exists for a system and method to reduce the number of wires that directly connect to the main circuit board, shorten wires between the circuit board and the sensors, and minimize noise signals.

SUMMARY OF THE INVENTION

The present invention provides an image forming apparatus that can be assembled in a simple way and has less possibility of inducing noise signals on a sensor connection wire.

The present invention also provides an image forming apparatus that includes a circuit board for controlling operations of a conveying unit in addition to a main circuit board, so that the number of wires that are directly connected to the main circuit board can be reduced.

According to an object of the present invention, an image forming apparatus is provided including a conveying unit for conveying a document, on which an image is recorded, along a predetermined conveying path, a scan unit that is disposed on the conveying path of the document for scanning the image recorded on the document, and a control unit for controlling the conveying unit and the scan unit. The control unit includes a main circuit board that controls operations of the scan unit and converts the scanned image into digital image information, and a sub-circuit board that controls operations of the conveying unit. The sub-circuit board includes a high voltage signal area on which a high voltage signal flows on one side portion, and a low voltage signal area on which a low voltage signal flows on the other side portion.

The conveying unit may include rollers for conveying the document, and a driving unit for supplying rotational force to the rollers, wherein the driving unit may be electrically connected to the high voltage signal area of the sub-circuit board via one or more wires.

The sub-circuit board may be installed so that the high voltage signal area is closer to the driving unit than the low voltage signal area.

The main circuit board may be electrically connected to the high voltage signal area of the sub-circuit board via one or more wires.

A required control signal may be transmitted through one or more wires connecting the main circuit board and the sub-circuit board.

The required control signal may include a power supplying signal, a communication signal, and a command signal, that is, an auto document feeding (ADF) signal or a duplex auto document feeding (DADF) signal that commands a conveying operation for reading one surface of the document, or for reading both surfaces of the document.

The sub-circuit board may be installed so that the high voltage signal area is closer to the main circuit board than the low voltage signal area.

The control unit may include sensors for detecting a position of the document on the conveying path, and the sensors may be electrically connected to the low voltage signal area of the sub-circuit board via one or more wires.

A plurality of sensors may be disposed in the control unit, and the control unit may further include an integrated circuit board that collects electric signals from the sensors and which is connected to the low voltage signal area of the sub-circuit board via one or more wires.

The sub-circuit board may be installed so that the low voltage signal area is closer to the integrated circuit board than the high voltage signal area.

The control unit may further include sensors for detecting a position of the document on the conveying path, and the sensors may be mounted on the low voltage signal area of the sub-circuit board.

The sub-circuit board may further include a microcomputer that performs calculations for controlling operations of the conveying unit.

The sub-circuit board may further include the microcomputer on the low voltage signal area, and the high voltage signal area may be formed on an external portion of the low voltage signal area.

BRIEF DESCRIPTION OF THE DRAWINGS

The above and other objects, features and advantages of the present invention will become more apparent by describing in detail exemplary embodiments thereof with reference to the attached drawings in which.

Throughout the drawings, like reference numerals will be understood to refer to like parts, components and structures.

DETAILED DESCRIPTION OF THE EXEMPLARY EMBODIMENTS

Hereinafter, the present invention will be described in detail by explaining exemplary embodiments of the present invention with reference to the attached drawings.

Figure 1:
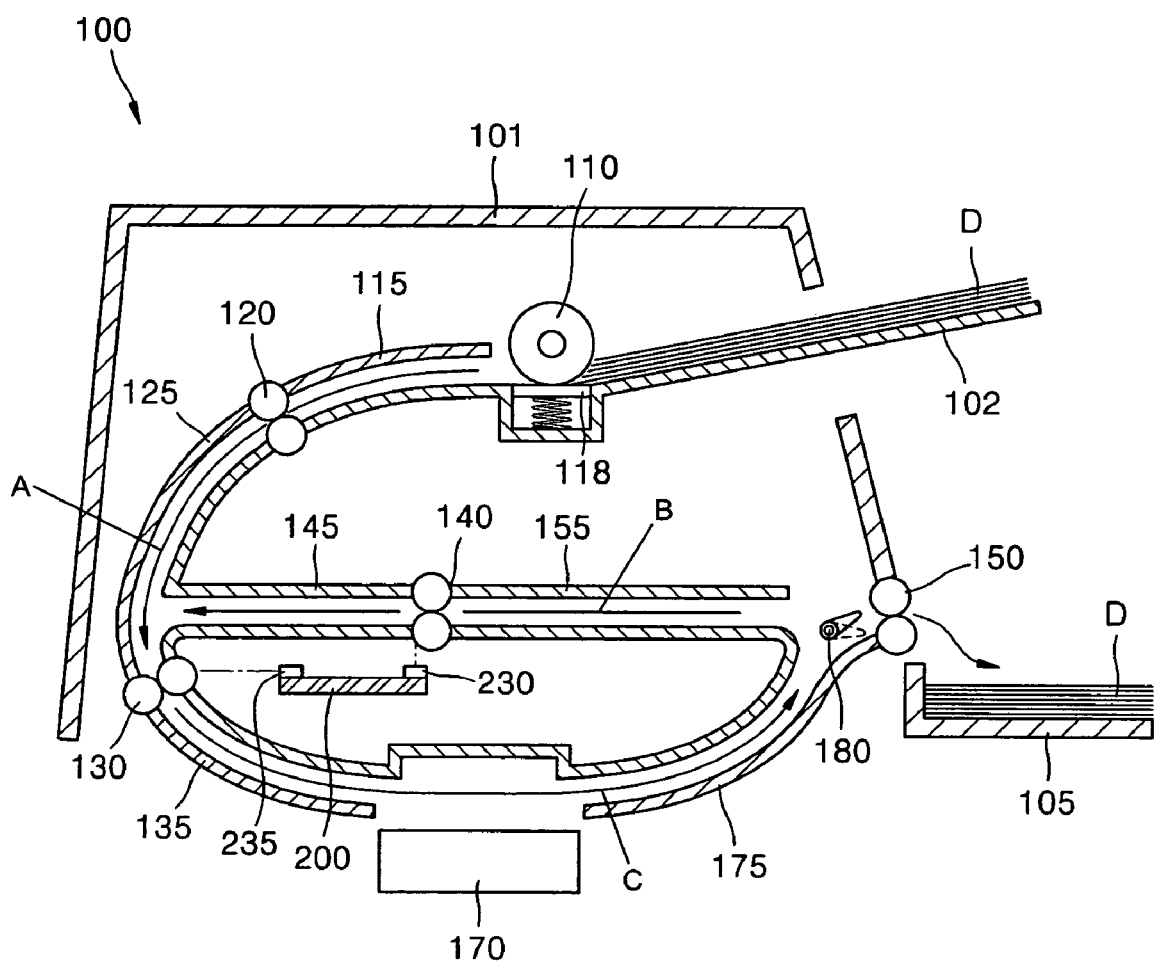
FIG. 1 is a cross-sectional side view showing an image forming apparatus according to an embodiment of the present invention.
Figure 2:
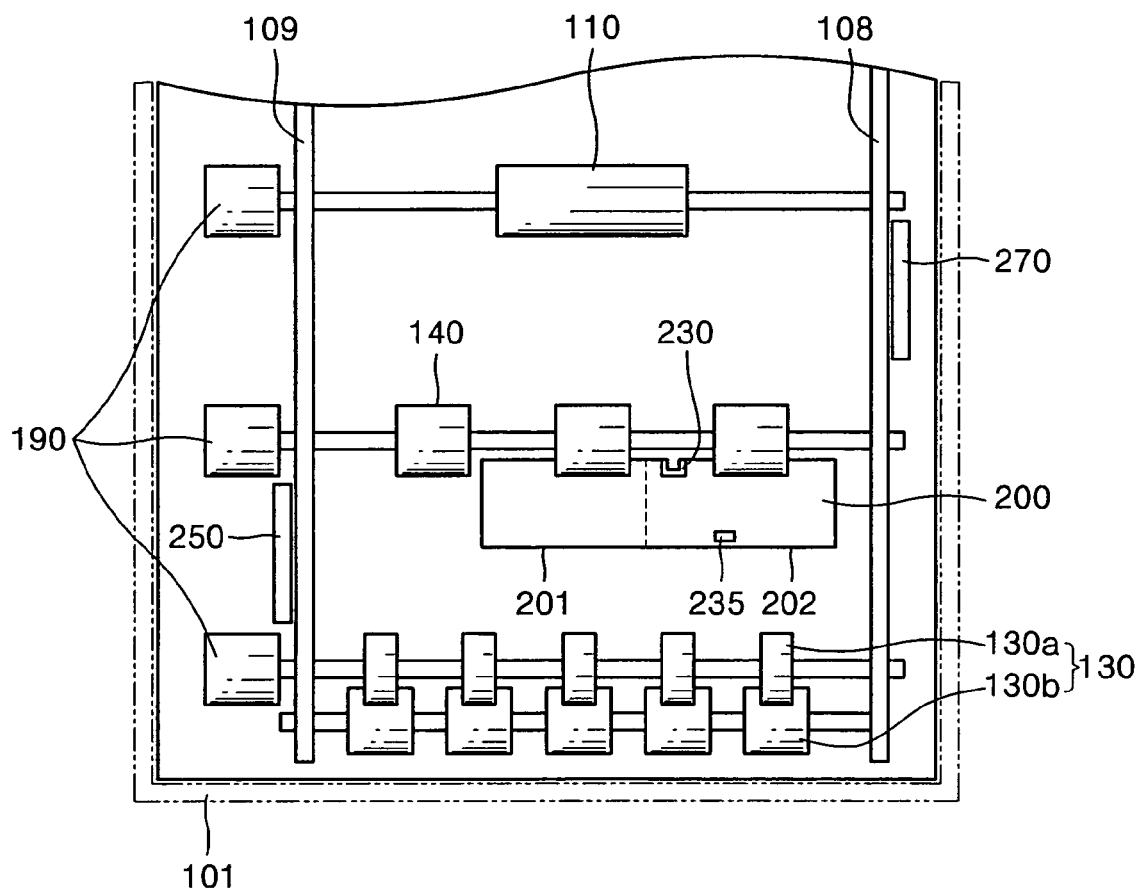
FIG. 2 is a plane view showing the image forming apparatus according to an embodiment of the present invention.

Referring to FIGS. 1 and 2, an image forming apparatus 100 according to an embodiment of the present invention comprises an image scan function, and more specifically, the image forming apparatus 100 of the present invention comprises an apparatus that can convey stacked documents one by one, and scan images on both surfaces of a document sheet. The image forming apparatus 100 includes a housing 101, a conveying unit that conveys a document (D), on which an image is recorded, along a predetermined conveying path, and a scan unit 170 that is disposed on the conveying path of the document to read the recorded image on the document.

The conveying unit has an auto document feeding (ADF) function, by which the documents D are conveyed one by one, and a duplex auto document feeding (DADF) function for reading the images recorded on both surfaces of the document D. The conveying unit includes a feeding board 102, on which the documents are stacked and which is slanted so that a front edge of the document D can be slid into the housing 101, a feeding roller 110 and a friction pad 118 facing the feeding roller 110, and which are disposed on the feeding board 102. The conveying unit further includes first and second conveying rollers 120 and 130 that convey the picked up document D along a path indicated by the arrow A of FIG. 1, a discharging roller 150 that discharges the document D out of the housing 101, and a document tray 105, on which the documents D discharged out of the housing 101 are stacked. Also, the conveying unit further includes a third conveying roller 140 that conveys the document D, a surface of which is already scanned, along a path indicated by the arrow B of FIG. 1, and a selector 180 that blocks the conveying path indicated by the arrow C selectively, so that the document D cannot proceed back along the path of arrow C. Also, guides 115, 125, 135, 145, 155, and 175 are provided to form the conveying path of the document D between the rollers 110, 120, 130, 140, and 150, and a driving unit 190 is provided to supply a rotary force to the rollers 110, 120, 130, 140, and 150.

As shown in FIG. 2, rotary shafts of the rollers are supported by frames 108 and 109 in the housing 101 so as to be rotatable. Although rollers 110, 130, and 140 are shown in FIG. 2, the remaining rollers which are not shown in FIG. 2 are provided in a substantially similar manner. The driving unit 190 is disposed on a space between the frame 109 and the housing 101, and is connected to an end portion of the rotary shaft for each roller requiring driving rotary force. For example, if only a driving roller 130a requires power rotation in the second conveying roller 130, then only the driving roller 130a is connected to the driving unit 190, and an idle roller 130b is not connected to the driving unit 190. The driving unit 190 can include one or more motors (not shown) that provide the rotating force, and one or more clutches (not shown) that transmit the rotating force of the motor selectively to the roller requiring the force.

Returning to FIG. 1, the scan unit 170 can include a charge-coupled device (CCD) module, and is located between the second conveying roller 130 and the discharge roller 150 to read the image on the lower surface of the document D.

Operations of the image forming apparatus 100 having the above structure will be now be described in greater detail. When the documents D, on which the images are recorded, are mounted on the feeding board 102, one of the documents D is picked up by the feeding roller 110 and passes through the first and second conveying rollers 120 and 130, and then passes the scan unit 170. The scan unit 170 irradiates rays to the document D to read the image recorded on the lower surface of the document D. The document D is then discharged and stacked on the document tray 105 by the rotation of the discharge roller 150.

When the DADF function is performed, the discharge roller 150 then rotates in reverse without discharging the document D, the lower surface of which has been successfully scanned, to then convey the document D toward the third conveying roller 140. Here, the selector 180 rotates at a predetermined angle as shown by the dashed line to prevent the document D from returning to the scan unit 170. The third conveying roller 140 rotates to make the document D proceed toward the second conveying roller 130, such that the document D is turned over and passes the scan unit 170 again, thus the other surface of the document D is read by the scan unit 170. The document D, the two surfaces of which are now scanned, is then discharged by the discharge roller 150 and stacked on the document tray 105. The selector 180 is returned to the original position represented by the solid line so as not to interrupt the discharging operation of the document D.

The image forming apparatus 100 also includes a control unit for controlling the conveying unit and the scan unit 170.

As shown in FIG. 2, the control unit includes a main circuit board 250, a sub-circuit board 200 connected to the main circuit board 250 via one or more wires, an integrated circuit board 270 connected to the sub-circuit board 200 via one or more wires, and sensors for detecting the position of the document D on the conveying path.

The main circuit board 250 comprises a main central processing unit (CPU) (not shown), and receives an image scan command from a computer connected to the image forming apparatus 100, or from an input unit such as a key pad (not shown) disposed on the image forming apparatus, and then transmits an ADF command or a DADF command to the conveying unit. In addition, the main circuit board 250 controls the operations of the scan unit 170, and converts the image scanned by the scan unit 170 into digital image information. Also, the main circuit board 250 transmits the digital image information to the connected computer or to any number of remote devices through a communication line, or transmits a printing command to a printing unit included in the image forming apparatus 100. To achieve this, the main circuit board 250 is disposed adjacent to the driving unit 190, and mounted on the frame 109.

The sub-circuit board 200 controls the operations of the conveying unit according to the ADF command or DADF command of the main circuit board 250, and is located so as not to interrupt the conveying path of the document D between the second conveying roller 130 and the third conveying roller 140. As shown in FIG. 2, the sub-circuit board 200 can be formed as a rectangle, and can be divided into a high voltage signal area 201 adjacent to the main circuit board 250, and a low voltage signal area 202 adjacent to the integrated circuit board 270 in a length direction thereof. The main circuit board 250 is connected to the high voltage signal area 201 via one or more wires.

The integrated circuit board 270 collects electric signals from the sensors (i.e., 230 and 235) that detect the position of the document D and transmits the signals to the sub-circuit board 200. The integrated circuit board 270 is connected to each of the sensors, and is further connected to the low voltage signal area 202 of the sub-circuit board 200 via one or more wires. The integrated circuit board 270 is positioned on the frame 108 that is disposed on the opposite side of the frame 109, on which the main circuit board 250 is mounted.

The sub-circuit board 200 is described in greater detail below with reference to FIGS. 3 and 4. For this example implementation of the present invention, it can be assumed that the driving unit 190, as shown in FIG. 2, includes two motors and three clutches, and seven photo sensors are disposed to detect the position of the document D.

Figure 3:
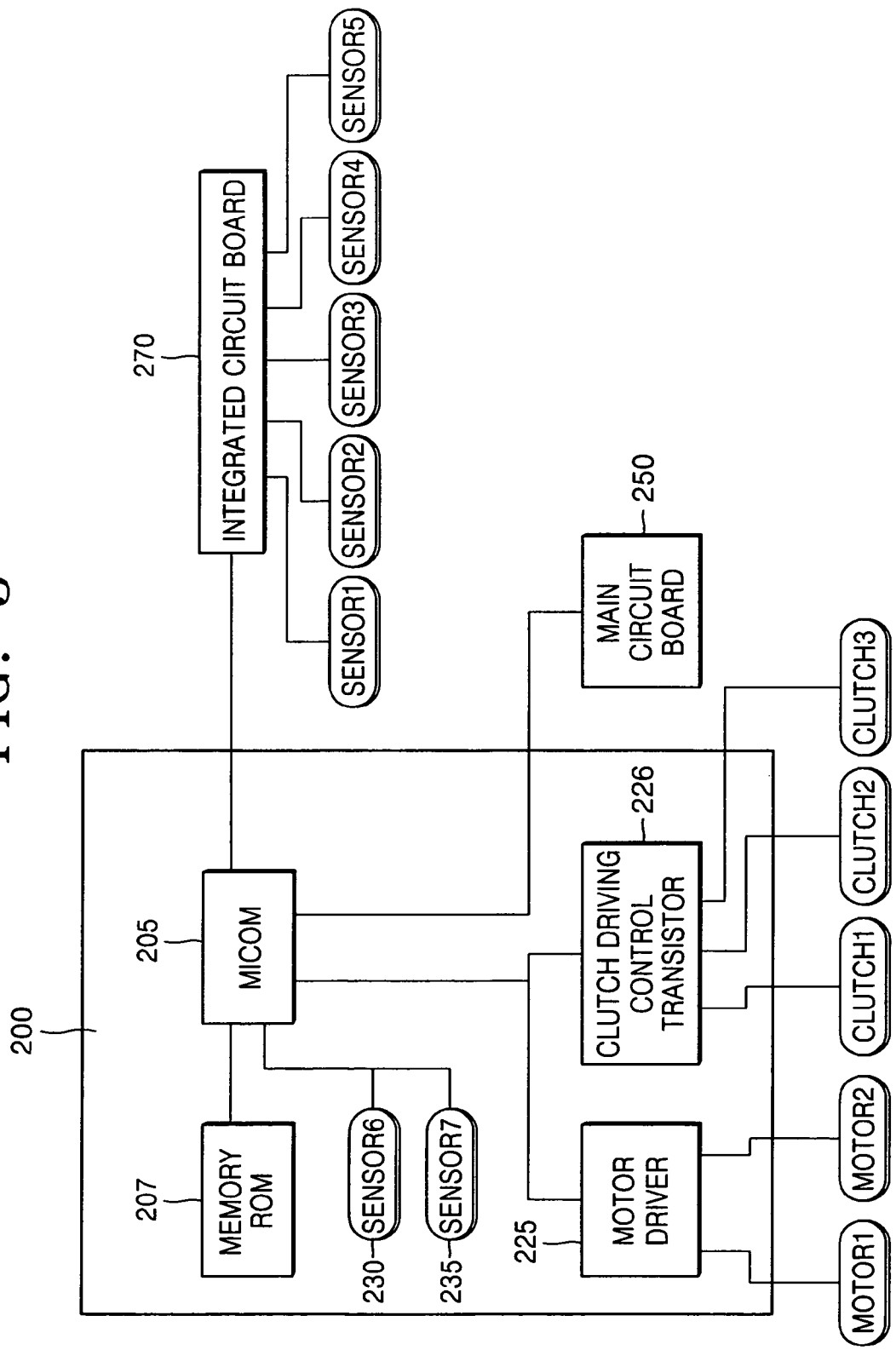
FIG. 3 is a block diagram illustrating a construction example of a control unit in the image forming apparatus according to an embodiment of the present invention.
Figure 4:
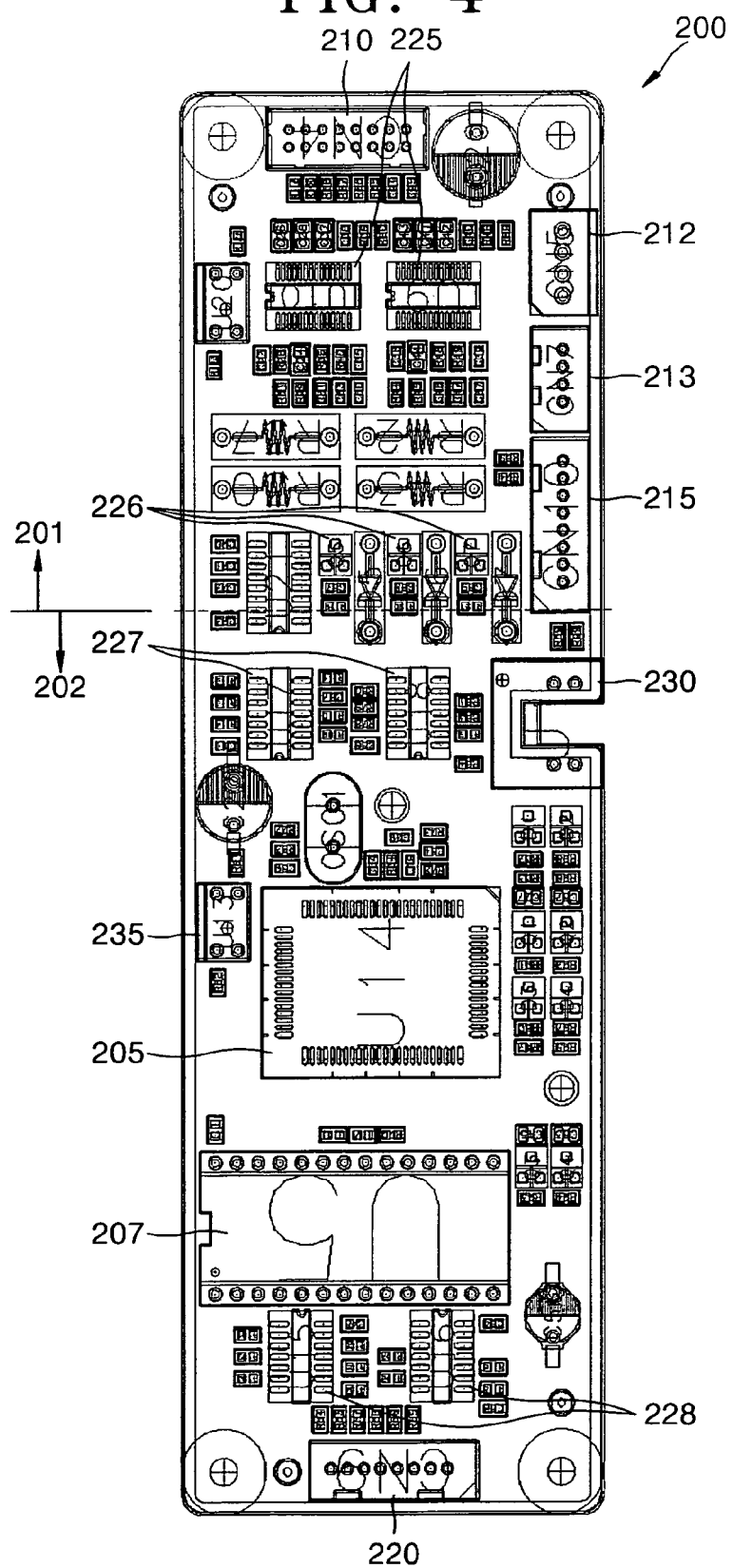
FIG. 4 is a plane view showing a sub-circuit board example of a control unit of a conveying unit adopted in the image forming apparatus according to an embodiment of the present invention.

As shown in FIG. 3, the sub-circuit board 200 includes a microcomputer 205 that is electrically connected to the main circuit board 250 and the integrated circuit board 270 to exchange electric signals therebetween, and is further electrically connected to a read only memory (ROM) 207 that stores a code for controlling the conveying unit, a motor driver 225, and a clutch driving control transistor 226. In addition, as shown in FIG. 4, the sub-circuit board 200 further includes a main circuit board connector 210 for connecting the sub-circuit board 200 to the main circuit board 250 via one or more wires, two motor connectors 212 and 213 for connecting the sub-circuit board 200 to the two motors via one or more wires, a clutch connector 215 for connecting the sub-circuit board 200 to the three clutches via one or more wires, and an integrated circuit board connector 220 for connecting the sub-circuit board 200 to the integrated circuit board 270 via one or more wires. Also, a buffer 227 is provided in the sub-circuit board 200 for delaying output signals which control the operations of the motors and the clutches, and a buffer 228 for delaying sensor signals received from the integrated circuit board 270.

Among the above described devices, a 24V electric signal is provided for the main circuit board connector 210, the motor connectors 212 and 213, the clutch connector 215, the motor driver 225, and the clutch driving control transistor 226 due to the 24V electric signal induced from the main circuit board 250. Therefore, the above devices 210, 212, 213, 215, 225, and 226 are disposed on the high voltage signal area 201 of the sub-circuit board 200. Specifically, the connectors 210, 212, and 213 are disposed on a circumferential portion of the sub-circuit board 200 in area 201 for easily performing the connecting operations of each. In addition, a 3.3V or 5V electric signal is provided for the microcomputer 205, the ROM 207, the integrated circuit board connector 220, and the buffers 227 and 228, therefore the above devices 205, 207, 220, 227, and 228 are disposed on the low voltage signal area 202. Specifically, the integrated circuit board connector 220 is disposed on a circumferential portion of the sub-circuit board 200 in area 202 for easily performing the connecting operation.

The low voltage signal area 202 can include two sensors 230 and 235 that are directly and electrically connected to the microcomputer 205, in addition to the five photosensors that are electrically connected to the integrated circuit board 270. As shown in FIGS. 1 and 2, the sensor 230 is located under the third conveying roller 140 to detect whether the document D passes through the third conveying roller 140, and the sensor 235 is located in front of the second conveying roller 130 to detect whether the document D passes through the second conveying roller 130. Since the two sensors 230 and 235 are directly connected to the microcomputer 205, connection distances are much shorter than those of the other five sensors, which are connected to the microcomputer 205 via the integrated circuit board 270, thus a noise signal will not be induced.

The sub-circuit board 200 is installed so that the high voltage signal area 201 thereof is closer to the main circuit board 250 and the driving unit 290 than the low voltage signal area 202, and the low voltage signal area 202 is closer to the integrated circuit board 270 than the high voltage signal area 201. Therefore, the 24V signal wires connected to the main circuit board 250 or the driving unit 190, and 3.3V or 5V signal wires connected to the integrated circuit board 270, are separated from each other. Thus, the possibility of interference between the 3.3V or 5V low voltage signals and the 24V high voltage signals can be reduced.

According to the image forming apparatus of the present invention, since the sub-circuit board for controlling operations of the conveying unit is configured to distribute the wires, the assembly of the apparatus is improved. In addition, the assembly of the image forming apparatus can be greatly improved by including the integrated circuit board that remotely collects the sensor wires, as in the embodiment of the present invention.

When the microcomputer is disposed on the sub-circuit board as described above, the wires of the conveying unit are not directly connected to the main circuit board, thus the number of wires that directly connect to the main circuit board can be reduced.

Also, the wires between the sub-circuit board and the sensors are shorter than the conventional wires between the main circuit board and the sensors, therefore noise signals that are generated in proportion to the length of the wire can be reduced.

In addition, since the wires on which the high voltage signal flows, and the wires on which the low voltage signal flows, do not cross each other but are separated from each other, and the area of high voltage signal processing and the area of low voltage signal processing are separated from each other, the high voltage signals do not interfere with the low voltage signals. Therefore, the possibility of noise signals generated due to the interference is reduced.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An image scanning apparatus comprising:
a conveying unit for conveying a document on which an image is recorded, along a predetermined conveying path;
a scan unit disposed on the conveying path of the document for scanning the image recorded on the document;
a control unit for controlling the conveying unit and the scan unit,
wherein the control unit comprises a main circuit board disposed at one side of the conveying path of the document for controlling operations of the scan unit and converting the scanned image into digital image information, a sub-circuit board disposed on the conveying path of the document for controlling operations of the conveying unit, and an integrated circuit board disposed at an opposite side of the conveying path of the document,
and wherein the sub-circuit board comprises a high voltage signal area on which a high voltage signal is routed and which is disposed closest to the main circuit board to group high voltage components at the one side of the conveying path of the document, and a low voltage signal area on which a low voltage signal is routed and which is disposed closest to the integrated circuit board to group low voltage components at the opposite side of the conveying path of the document; and
at least one document sensor disposed on the conveying path of the document and electrically coupled to the sub-circuit board.

2. The apparatus of claim 1, wherein the conveying unit comprises:
a plurality of rollers for conveying the document; and
a driving unit for supplying rotational force to the rollers, and wherein the driving unit is electrically connected to the high voltage signal area of the sub-circuit board via one or more wires.

3. The apparatus of claim 2, wherein the sub-circuit board is installed so that the high voltage signal area is closer to the driving unit than the low voltage signal area.

4. The apparatus of claim 1, wherein the main circuit board is electrically connected to the high voltage signal area of the sub-circuit board via one or more wires.

5. The apparatus of claim 4, wherein a control signal is transmitted through one or more wires connecting the main circuit board and the sub-circuit board.

6. The apparatus of claim 5, wherein the control signal comprises at least one of a power supplying signal, a communication signal, and a command signal.

7. The apparatus of claim 6, wherein the command signal comprises at least one of an auto document feeding signal and a duplex auto document feeding signal to command a conveying operation for reading one surface of the document or for reading both surfaces of the document, respectively.

8. The apparatus of claim 1, wherein the control unit comprises:
the document sensor for detecting a position of the document on the conveying path, and wherein the document sensor is electrically connected to the low voltage signal area of the sub-circuit board via one or more wires.

9. The apparatus of claim 8, further comprising:
a plurality of sensors coupled to the control unit, wherein the control unit further comprises the integrated circuit board for collecting electric signals from the plurality of sensors and which is further connected to the low voltage signal area of the sub-circuit board via one or more wires.

10. The apparatus of claim 1, wherein the control unit further comprises:
the document sensor for detecting a position of the document on the conveying path, and wherein the sensor is mounted on the low voltage signal area of the sub-circuit board.

11. The apparatus of claim 1, wherein the sub-circuit board comprises a microcomputer to perform calculations for controlling an operation of the conveying unit.

12. The apparatus of claim 11, wherein the microcomputer is disposed on the low voltage signal area.

13. The apparatus of claim 11, wherein the high voltage signal area is formed on an external portion of the low voltage signal area.

14. An image scanning apparatus comprising:
a conveying unit for conveying a document on which an image is recorded, along a predetermined conveying path;
a scan unit disposed on the conveying path of the document for scanning the image recorded on the document; and
a control unit for controlling the conveying unit and the scan unit,
wherein the control unit comprises a main circuit board that controls operations of the scan unit and converts the scanned image into digital image information, and a sub-circuit board that controls operations of the conveying unit,
and wherein the sub-circuit board comprises a high voltage signal area on which a high voltage signal is routed, and a low voltage signal area on which a low voltage signal is routed and at least one document sensor mounted on the sub-circuit board for detecting a position of the document on the conveying path.

15. The apparatus of claim 14, wherein the conveying unit comprises:
a plurality of rollers for conveying the document; and
a driving unit for supplying rotational force to the rollers, and wherein the driving unit is electrically connected to the high voltage signal area of the sub-circuit board via one or more wires.

16. The apparatus of claim 14, further comprising:
a plurality of sensors coupled to the control unit, and wherein the control unit further comprises an integrated circuit board that collects electric signals from the plurality of sensors and is further connected to the low voltage signal area of the sub-circuit board via one or more wires.

17. The apparatus of claim 14, wherein the sub-circuit board comprises a microcomputer to perform calculations for controlling an operation of the conveying unit.

18. The apparatus of claim 14, wherein the at least one document sensor comprises a first document sensor to detect a document passing on a scanning path, and a second document sensor to detect a document passing on a reversing path.

* * * * *